United States Patent
Chen et al.

(10) Patent No.: US 10,809,635 B2
(45) Date of Patent: Oct. 20, 2020

(54) DEFECT INSPECTION METHOD AND DEFECT INSPECTION SYSTEM

(71) Applicant: Taiwan Semiconductor Manufacturing Co., Ltd., Hsinchu (TW)

(72) Inventors: Chien-Huei Chen, Kaohsiung (TW); Hung-Yi Chung, Taoyuan (TW); Chao-Ting Hong, Taipei (TW); Cheng-Kuang Lee, Taipei (TW); Xiaomeng Chen, Hsinchu County (TW); Teng-Cheng Hsu, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 230 days.

(21) Appl. No.: 15/939,311

(22) Filed: Mar. 29, 2018

(65) Prior Publication Data

US 2019/0155164 A1    May 23, 2019

Related U.S. Application Data

(60) Provisional application No. 62/588,838, filed on Nov. 20, 2017.

(51) Int. Cl.
*G01N 21/88*    (2006.01)
*G03F 7/20*     (2006.01)
(Continued)

(52) U.S. Cl.
CPC ....... *G03F 7/7065* (2013.01); *G01N 21/8851* (2013.01); *G01N 21/9501* (2013.01); *G01N 21/956* (2013.01); *G06T 7/001* (2013.01); *H01J 37/28* (2013.01); *G01N 2021/8854* (2013.01); *G01N 2021/8867* (2013.01);
(Continued)

(58) Field of Classification Search
None
See application file for complete search history.

(56) References Cited

U.S. PATENT DOCUMENTS

2015/0254832 A1* 9/2015 Plihal ................... G06T 7/001
                                                     382/149
2016/0328837 A1* 11/2016 He ..................... G06K 9/6292
(Continued)

*Primary Examiner* — Vikkram Bali
(74) *Attorney, Agent, or Firm* — JCIPRNET

(57) ABSTRACT

A defect inspection method and a defect inspection system are provided. In the method, a plurality of candidate defect images are retrieved from inspection images obtained by at least one optical inspection tool performing hot scans on at least one wafer and a plurality of attributes are extracted from the inspection images. A random forest classifier including a plurality of decision trees for classifying the candidate defect images is created, wherein the decision trees are built with different subset of the attributes and the candidate defect images. A plurality of candidate defect images are retrieved from the optical inspection tool in runtime and applied to the decision trees, and classified into nuisance images and real defect images according to votes of the decision trees in which the nuisance images are filtered out. The real defect images with the votes over a confidence value are sampled for microscopic review.

20 Claims, 9 Drawing Sheets

(51) Int. Cl.
*G06T 7/00* (2017.01)
*G01N 21/95* (2006.01)
*G01N 21/956* (2006.01)
*H01J 37/28* (2006.01)

(52) U.S. Cl.
CPC ............... *G01N 2021/8883* (2013.01); *G06T 2207/10056* (2013.01); *G06T 2207/20076* (2013.01); *G06T 2207/30148* (2013.01)

(56) References Cited

U.S. PATENT DOCUMENTS

2016/0358041 A1* 12/2016 Venkataraman ...... G06K 9/6269
2018/0285493 A1* 10/2018 Huang .................... H01L 25/50

* cited by examiner

DEFECT INSPECTION METHOD AND DEFECT INSPECTION SYSTEM

CROSS REFERENCE TO RELATED APPLICATION

This application claims the priority benefit of U.S. provisional application Ser. No. 62/588,838, filed on Nov. 20, 2017. The entirety of the above-mentioned patent application is hereby incorporated by reference herein and made a part of specification.

BACKGROUND OF THE INVENTION

1. Field of the Invention

The disclosure relates to a method and a system for defect inspection.

2. Description of Related Art

In the manufacturing processes of modem semiconductor devices, various materials and machines are manipulated to create a final product. Manufacturers have dedicated to reduce particulate contamination during processing so as to improve product yield. Due to the increasing complexity of semiconductor devices and the development of ultra-small transistors, the need for defect detection and control is further emphasized.

The inspection on the semi-manufactured product is frequently performed during manufacture by using optical inspection tool in order to timely find the defects. The optical inspection tool may analyze the scanned images to identify defect types and locate the defects on the wafer, so as to assist the operator in evaluating and correcting the manufacturing processes that cause the defects.

In order to detect sub-design-rule defects, the optical inspection tools are run at very high sensitivity, causing very high nuisance rate. The current solution to filter out nuisances is based on a decision tree and relies upon experienced operators to manually explore feature space and fine-tune tree cuts, which consumes considerable time and labor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DESCRIPTION OF THE EMBODIMENTS

Figure 1:
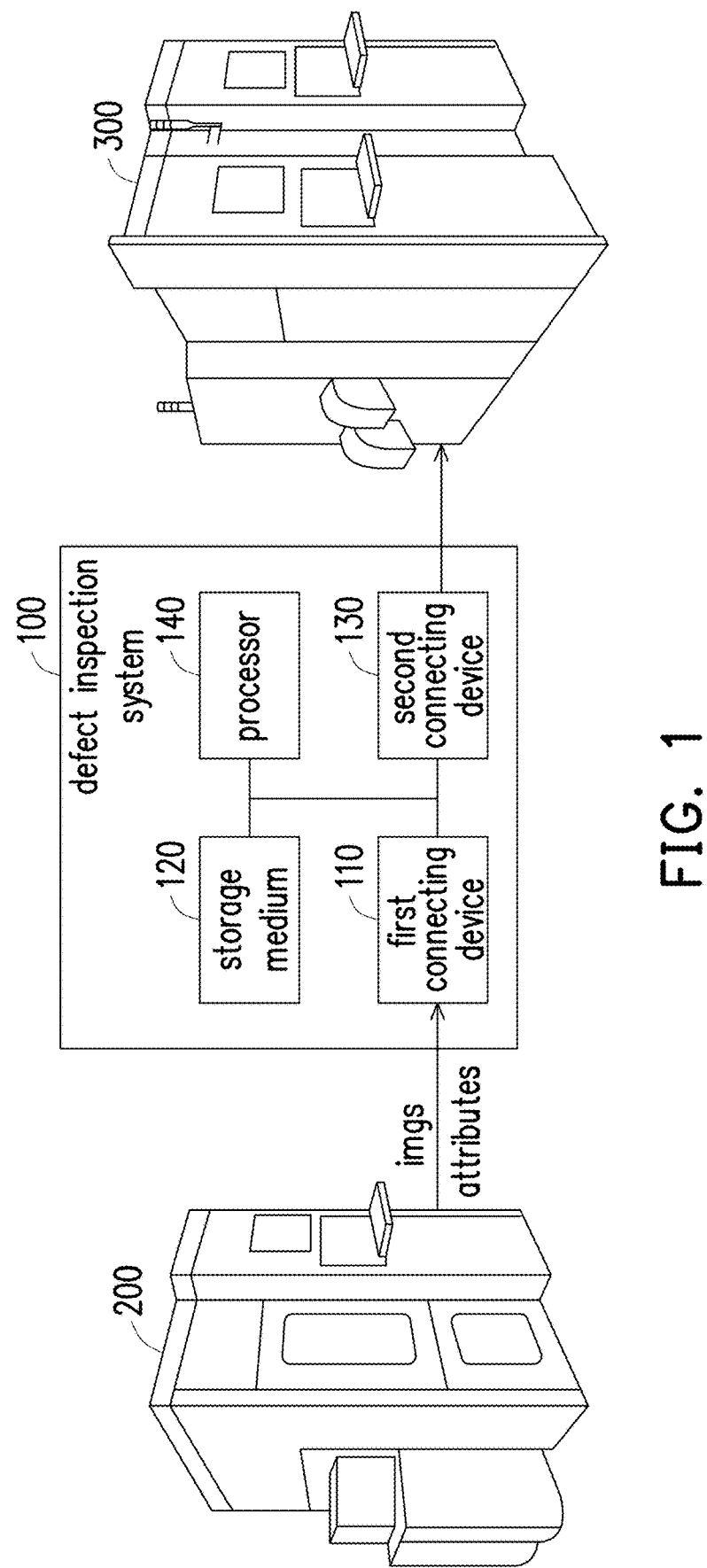
FIG. 1 illustrates a schematic block diagram of a defect inspection system according to an embodiment of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
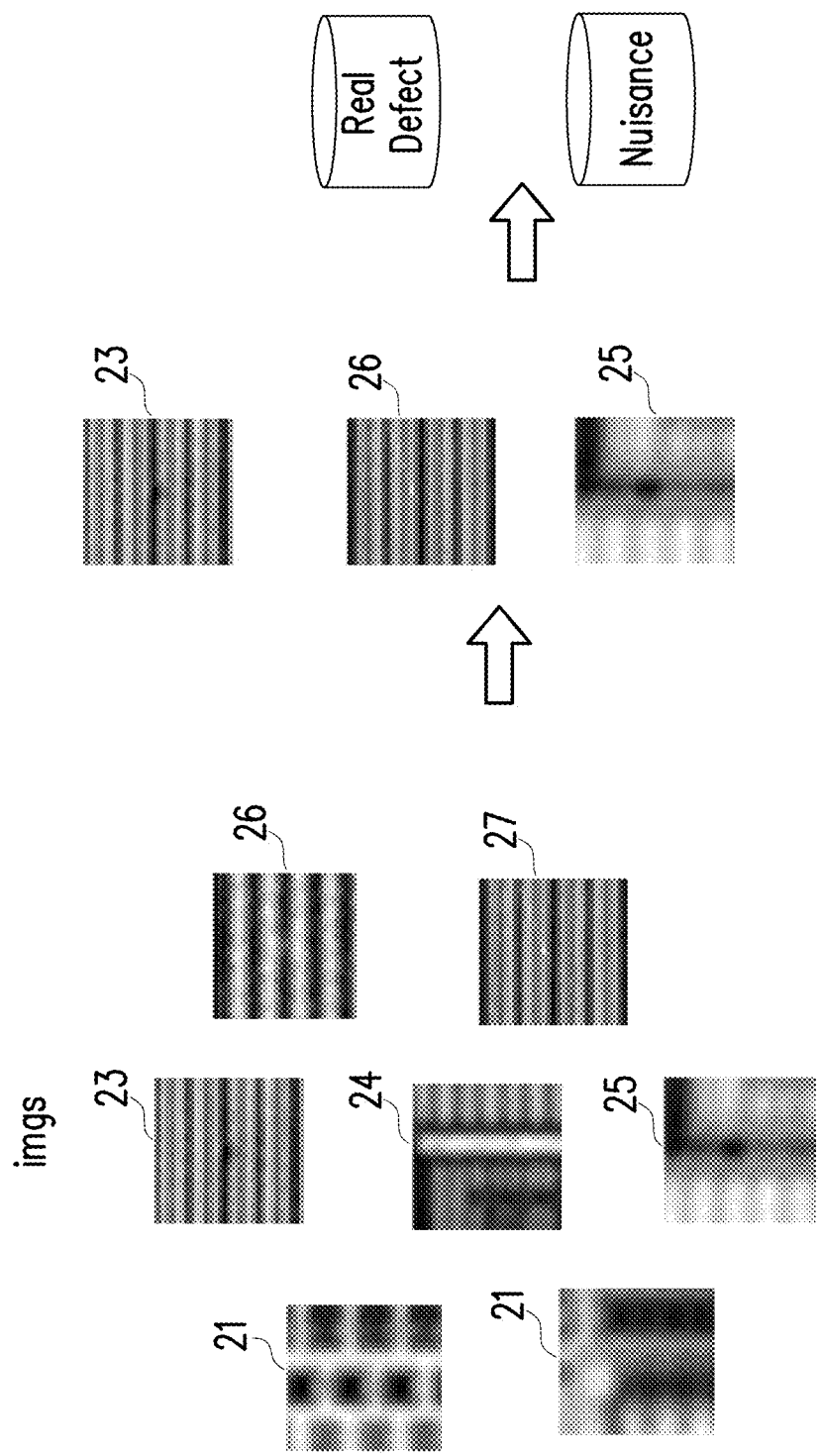
FIG. 2 illustrates a schematic diagram illustrating the filtering and classification on the defect images according to an embodiment of the disclosure.

FIG. 1 illustrates a schematic block diagram of a defect inspection system according to an embodiment of the disclosure. FIG. 2 illustrates a schematic diagram illustrating the filtering and classification on the defect images according to an embodiment of the disclosure. Referring to FIG. 1, a defect inspection system 100 includes a first connecting device 110, a second connecting device 120, a storage medium 130, and a processor 140 coupled to the first connecting device 110, the second connecting device 120 and the storage medium 130.

In some embodiments, the defect inspection system 100 is externally connected to at least one optical inspection tool (an optical inspection tool 200 is taken as an example in the embodiment) and configured to retrieve candidate defect images imgs (e.g. the images 21 to 27 shown in FIG. 2) from the optical inspection tool 200 by the first connecting device 110, where the optical inspection tool 200 is configured to perform hot scans on at least one wafer. The defect inspection system 100 is configured to analyse the retrieved candidate defect images imgs to filter out nuisance images. On the other hand, the defect inspection system 100 is connected to a defect review tool 300 and configured to sample the rest candidate defect images after filtering and transmit the sampled candidate defect images (e.g. the images 23, 25 and 26 shown in FIG. 2) to the defect review tool 300 for microscopic review so as to verify real defects and nuisances. The defect review tool 300 is, for example, a high resolution scanning electron microscope (SEM) review tool, or a laser-based defect review tool, but the disclosure is not limited thereto.

In some embodiments, the defect inspection system 100 may be disposed or embedded in the optical inspection tool 200, which is not limited herein. The defect inspection system 100, the optical inspection tool 200 and the defect review tool 300 will be described in detail in the following descriptions.

The first connecting device 110 is configured to connect to the optical inspection tool 200 to retrieve candidate defect images imgs from a plurality of inspection images obtained by the optical inspection tool 200. The first connecting device is, for example, any wired or wireless interface compatible to the optical inspection tool 200 such as USB, firewire, thunderbolt, universal asynchronous receiver/transmitter (UART), serial peripheral interface bus (SPI), WiFi, or Bluetooth, which is not limited herein.

The second connecting device 120 is configured to connect to the defect review tool 300 to transmit the sampled candidate defect images to the defect review tool 300 for microscopic review. The second connecting device 120 is, for example, any wired or wireless interface compatible to the defect review tool 300 such as USB, firewire, thunderbolt, UART, SPI, WiFi, or Bluetooth, which is not limited herein.

The storage medium 130 is configured to store the candidate defect images retrieved by the first connecting device 110. The candidate defect images from the optical inspection tool 200 takes a considerable amount of memory storage, hence the storage medium 120 is, for example, a mass storage device, a redundant array of independent disks (RAID), other similar storage device or a combination thereof having a high storage capacity, but the disclosure is not limited thereto.

The processor 140 is configured to execute instructions for carrying out the defect inspection method of the embodiments of the disclosure. The processor 140 is, for example, a central processing unit (CPU), other programmable general-purpose or specific-purpose microprocessors, a digital signal processor (DSP), a programmable controller, an application specific integrated circuit (ASIC), a programmable logic device (PLD), other similar devices, or a combination thereof, but the disclosure is not limited thereto.

The defect inspection system 100 is adapted for carrying out a defect inspection method in accordance with some embodiments of the present disclosure. In detail, FIG. 3 is a flowchart illustrating a defect inspection method according to an embodiment of the disclosure.

Figure 3:
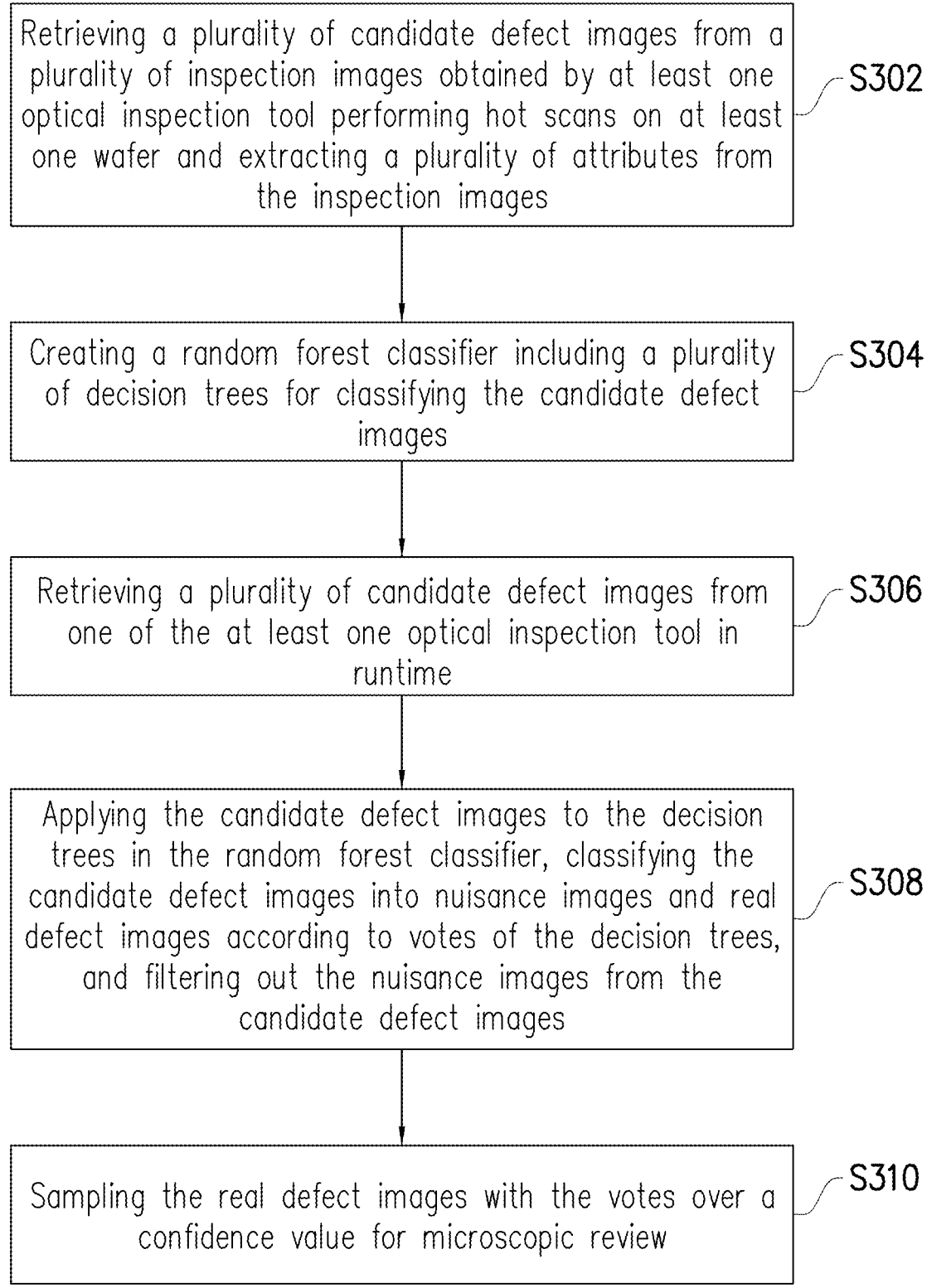
FIG. 3 is a flowchart illustrating a defect inspection method according to an embodiment of the disclosure.

Referring to FIG. 3, in step S302, the processor 140 of the defect inspection system 100 retrieves a plurality of candidate defect images from a plurality of inspection images obtained by at least one optical inspection tool 200 performing hot scans on at least one wafer and extracts a plurality of attributes from the inspection images. In some embodiments, the sensitivity of the optical inspection on the wafer in the optical inspection tool 200 may be set to be high and the detection algorithm may compare the output (i.e. inspection images) of the optics of the optical inspection tool 200 with a threshold set to be low, thereby rendering the sensitivity of the optical inspection tool 200 to be very high.

When retrieving the candidate defect images, the processor 140 further extracts the attributes from the inspection images. In some embodiments, the attributes may include attributes extracted from the inspection images such as rippleness, reference intensity, a tool ID of the optical inspection tool, or a region ID of a region in the wafer. In some embodiments, the attributes may further include in-line attributes provided by the optical inspection tool 200 such as defect magnitude, defect area, or polarity. Based on the observation on defect images, it is found the defects usually have a pattern similar to a ripple such that by calculating a rippleness between the candidate defect image and the ripple images and importing the rippleness into the classifier as a training factor, the robustness of the classifier can be enhanced. Similarly, since the defect images generated by the same optical defect tool and/or from the same region in the wafer may have similar image characteristics such as brightness or contrast, by importing the tool ID and the region ID into the classifier as training factors, the robustness of the classifier can also be enhanced.

Figure 4:
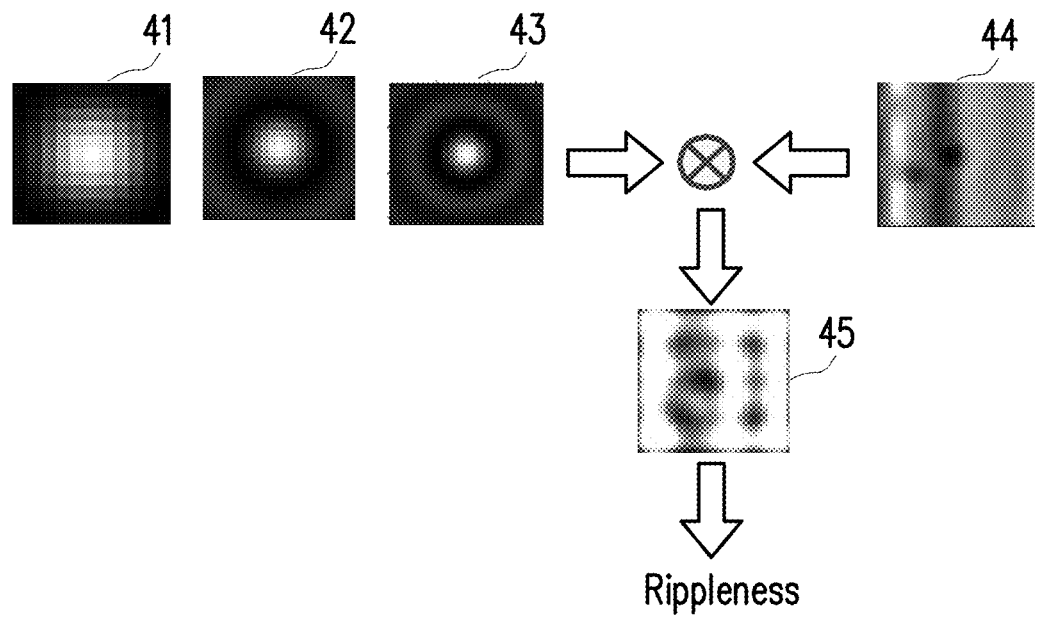
FIG. 4 is a schematic diagram illustrating the extraction of rippleness according to an embodiment of the disclosure.

For example, FIG. 4 is a schematic diagram illustrating the extraction of rippleness according to an embodiment of the disclosure. Referring to FIG. 4, a plurality of ripple images (e.g. images 41 to 43) are previously created and used to train a deep learning model such as a convolutional neural network (CNN). The CNN includes an input layer, an output layer and multiple hidden layers including convolutional layers, pooling layers, etc. Whenever a candidate defect image 44 is retrieved, the candidate defect image 44 is used as an input of the CNN and a convolution operation is applied to the candidate defect image 44 to obtain a convoluted result (e.g. image 45). In addition, a max-pooling is applied to partition the image 45 into a set of non-overlapping rectangles and finally the maximum in each sub-region is output as the rippleness.

Back to the flow in FIG. 3, in step S304, the processor 140 creates a random forest classifier including a plurality of decision trees for classifying the candidate defect images, wherein the decision trees are built with different subset of the attributes and the candidate defect images. In detail, the random forest is an ensemble learning method for classification that operates by constructing multiple decision trees at training and outputting a final class based on the votes of the decision trees. In some embodiments, a number of 500 decision trees are built in the random forest classifier and each of the decision trees is built with randomly selected 10 attributes. Further, each of the decision trees in the random forest classifier is trained with a portion (e.g. two-third) of the candidate defect images that are randomly selected and a performance of the decision tree is checked whether stable with the other portion (e.g. one-third) of the candidate defect images.

Figure 5:
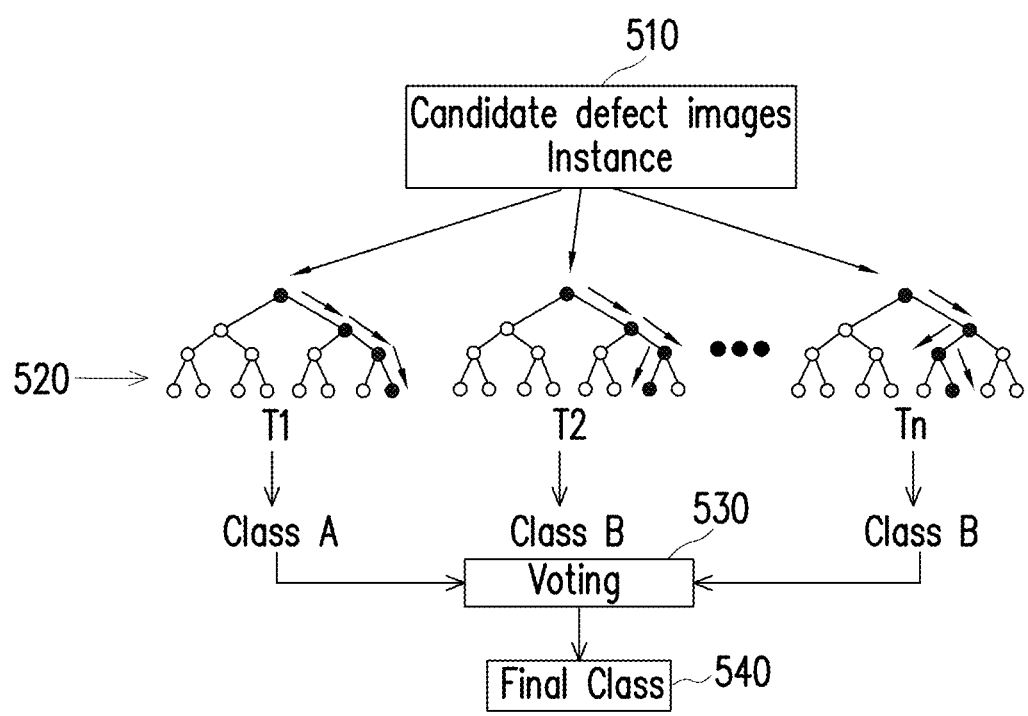
FIG. 5 is schematic diagram illustrating random forest classification according to an embodiment of the disclosure.

For example, FIG. 5 is schematic diagram illustrating random forest classification according to an embodiment of the disclosure. Referring to FIG. 5, the candidate defect images 510 retrieved in the aforesaid embodiment are used as inputs of multiple decision trees T1 to Tn (n is an integer larger than 1) of a random forest classifier 520 in which the decision trees T1 to Tn are built with different subset of the attributes as described above and the classes determined from among predetermined classes (e.g. Class A output by tree T1, Class B output by tree T2, and Class B output by tree Tn) are output. The classes to be voted by the decision trees T1 to Tn include, for example, defect, killer defect, and nuisance, but the disclosure is not limited thereto. A voting 530 is further performed on the outputs of the decision trees T1 to Tn and a final class 540 having the highest votes is determined.

In the runtime (e.g. the period that the defect inspection system performs the defect inspection on the wafer desired to be inspected), in step S306, the processor 140 retrieves a plurality of candidate defect images from one of the optical inspection tool 200 and then in step S308, applies the candidate defect images to the decision trees in the random forest classifier, classifies the candidate defect images into nuisance images and real defect images according to votes of the decision trees, and filters out the nuisance images from the candidate defect images.

In some embodiments, various confidence values serving as thresholds to be compared with the votes of the decision trees are used to determine decision boundaries for classifying the candidate defect images. In some embodiments, two confidence values are used to determine two decision boundaries for classifying the candidate defect images into high confidence defects, marginal defects and nuisances. In detail, the candidate defect images with the votes higher than or equal to a first confidence value are classified as images of high confidence defect, the candidate defect images with the votes lower than the first confidence value and higher than or equal to a second confidence value are classified as images of marginal defect, and the candidate defect images with the votes lower than the second confidence value are classified as the nuisance images in which the first confidence value is higher than the second confidence value.

Figure 6A:
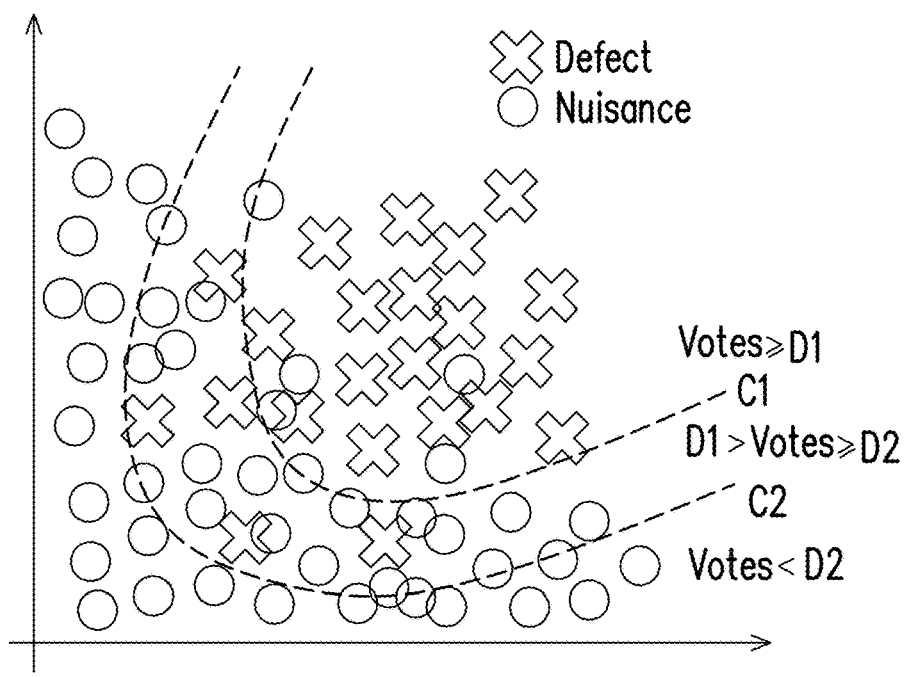
FIG. 6A is a graph illustrating the classification of defects and nuisances by using confidence values according to an embodiment of the disclosure.
Figure 6B:
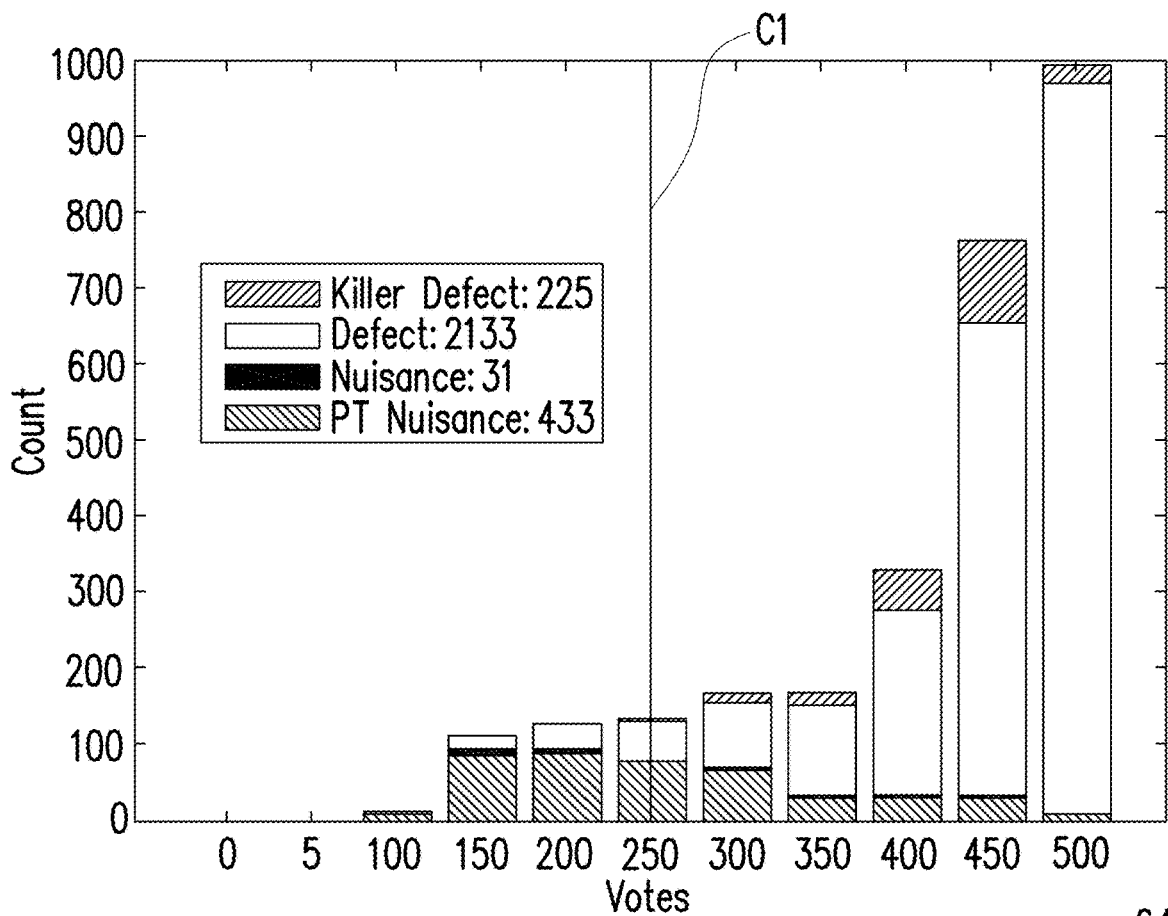
FIG. 6B is a defect votes histogram illustrating a distribution of defects and nuisances with respect to votes according to an embodiment of the disclosure.

For example, FIG. 6A is a graph illustrating the classification of defects and nuisances by using confidence values according to an embodiment of the disclosure and FIG. 6B is a defect votes histogram illustrating a distribution of defects and nuisances with respect to votes according to an embodiment of the disclosure.

Referring to FIG. 6A, assuming the defects and nuisances are distributed in a feature space as shown in graph 62, the defects and nuisances are separated into three zones by two decision boundaries C1 and C2 according to two confidence values D1 and D2 (e.g. D1 is 250 and D2 is 10). That is, the candidate defect images with the votes higher than or equal to D1 are classified as defects, and the candidate defect images with the votes lower than D2 are classified as nuisances. Further, the candidate defect images with the votes lower than D1 and higher than or equal to D2 are classified as marginal defects.

Accordingly, the decision boundary C2 is used as a nuisance cut to filter out the nuisances among the candidate defect images without losing defects, and the decision boundary C1 is used as a confidence margin to keep high confidence defects for review. The decision boundary C1 separates the rest feature space into a real defect zone (with strong defects and few nuisances) and a marginal defect zone (with few weak defects and lots of nuisances).

Referring to FIG. 6B, each bar in the defect votes histogram 64 depicts a defect count and a distribution of defects and nuisances with various types including killer defects, (normal) defects, nuisances, and PT nuisance, and the decision boundary C1 is located at the bar with 250 votes. Referring to the bars on the right of the decision boundary C1, it is observed that a proportion of real defects among the defect images increases as the votes increase and killer defects can be found within the defect images with high votes while less nuisances are found within the defect images with the votes higher than 250.

In some embodiments, the candidate defect images within the marginal defect zone may be further used for purity control. In detail, the images of high confidence defect (i.e. the images within the real defect zone) are applied for the microscopic review so as to verify the real defect images among the images of high confidence defect. On the other hand, the images of marginal defect (i.e. the images within the marginal defect zone) are sampled with a sampling rate and the sampled images of marginal defect are applied for the microscopic review so as to verify the real defect images among the images of marginal defect. Finally, a defect count may be estimated by adding a number of the verified real defect images among the images of high confidence defect to a total of the real defect images among the images of marginal defect, wherein the total of the real defect images among the images of marginal defect is deduced by dividing a number of the verified real defect images among the images of marginal defect by the sampling rate.

Back to the flow in FIG. 3, in step S310, the processor 140 samples the real defect images with the votes over a confidence value and transmits the sampled real defect images to the defect review tool 300 for microscopic review.

In some embodiments, after the real defect images are sampled or verified via the microscopic review in step S310, the processor 140 may return to step S306 to retrieve a plurality of candidate defect images from another one of the optical inspection tool 200 that performs hot scans on another wafer and repeats step S308 and S310 so as to perform defect inspection on the another wafer.

Based on the above, since the nuisance cut for filtering the nuisances and the confidence margin for finding real defects are automatically derived from the votes of the random forest identifier, the labor and time consumed to filter the nuisance can be reduced. Further, by filtering out the nuisance images while keeping the high confidence defect images for microscopic review, the efficiency of the defect review tool can be enhanced.

In some embodiments, due to the great amount of nuisance, the inspection on the candidate defect images may be divided into multiple stages and different classifiers specific to different objects (e.g. different defect types or different nuisance types) are respectively created in different stages so as to improve the effectiveness of nuisance filtering.

Figure 7:
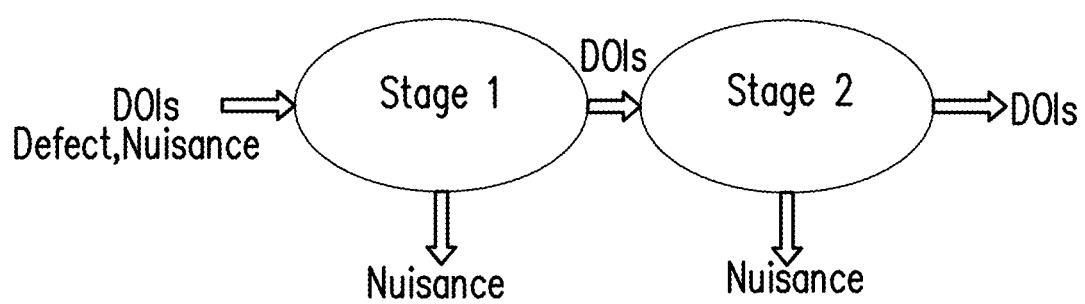
FIG. 7 is a schematic diagram illustrating two-stage filtering according to an embodiment of the disclosure.

In detail, FIG. 7 is a schematic diagram illustrating two-stage filtering according to an embodiment of the disclosure. As shown in FIG. 7, the defect inspection is divided into stage 1 and stage 2, in which a first random forest classifier including a plurality of first decision trees built with a first subset of the attributes is created and a second random forest classifier including a plurality of second decision trees built with a second subset of the attributes having a complexity in a decision boundary higher than a complexity in a decision boundary of the first subset of the attributes is created.

In detail, when the images of defects of interest (DOIs) (having an amount of one hundred thousand, for example) including defect images and nuisance images are retrieved, in stage 1, those DOIs are applied to the first decision trees in the first random forest classifier and the nuisance images are filtered out according to votes of the first decision trees on the DOIs. In stage 2, the rest DOIs after filtering are applied to the second decision trees in the second random forest classifier.

Since the first decision trees are built with the attributes having less complexity in the decision boundary, most (e.g.

tens of thousands) of general nuisance images can be filtered out while keeping real defect images in stage 1. The rest DOIs (having an amount of several thousands) after filtering are then applied to the second decision trees that are built with higher complexity in the decision boundary. As a result, the nuisance images can be further recognized and carefully filtered out. Finally, the rest DOIs with the votes over a confidence value are sampled and transmitted to the defect review tool for microscopic review.

Through the method described above, since most of general nuisance images are filtered out in stage 1, a classifier trained with obvious nuisances can be applied to recognize and filter out most of the nuisances. As a result, the effectiveness of nuisance filtering can be improved.

In some embodiments, the defects found by the optical inspection tool 200 through unsupervised learning may be further used to verify the defects found by the defect inspection system 100 as described in the aforesaid embodiments such that new defect types can be observed and the classifier can be updated to cover all defect types.

Figure 8:
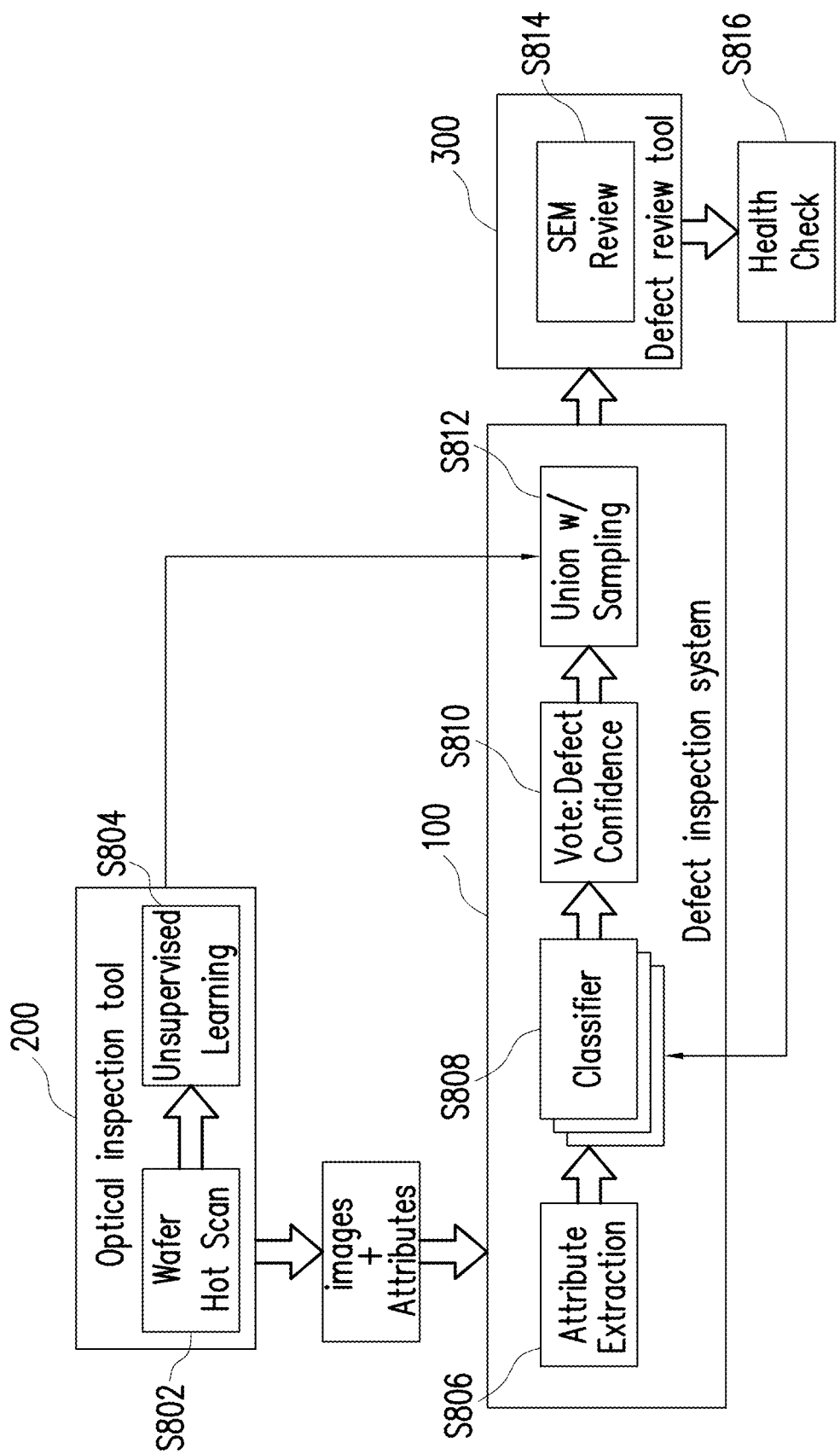
FIG. 8 is a schematic diagram illustrating a defect inspection method according to an embodiment of the disclosure.

In detail, FIG. 8 is a schematic diagram illustrating a defect inspection method according to an embodiment of the disclosure. Referring to FIG. 8, the defect inspection system 100 together with the optical inspection tool 200 is adapted for carrying out a defect inspection method in accordance with some embodiments of the present disclosure.

In step S802, the optical inspection tool 200 performs hot scans on at least one wafer to generate a plurality of inspection images. In step S804, the optical inspection tool 200 performs unsupervised learning on the candidate defect images retrieved from the inspection images. In detail, defects of similar types tend to form clusters in feature space and the strongest samples in each cluster or the samples deviated away from the cluster centroids (i.e. outliers) have higher probability of being real defects.

Figure 9A:
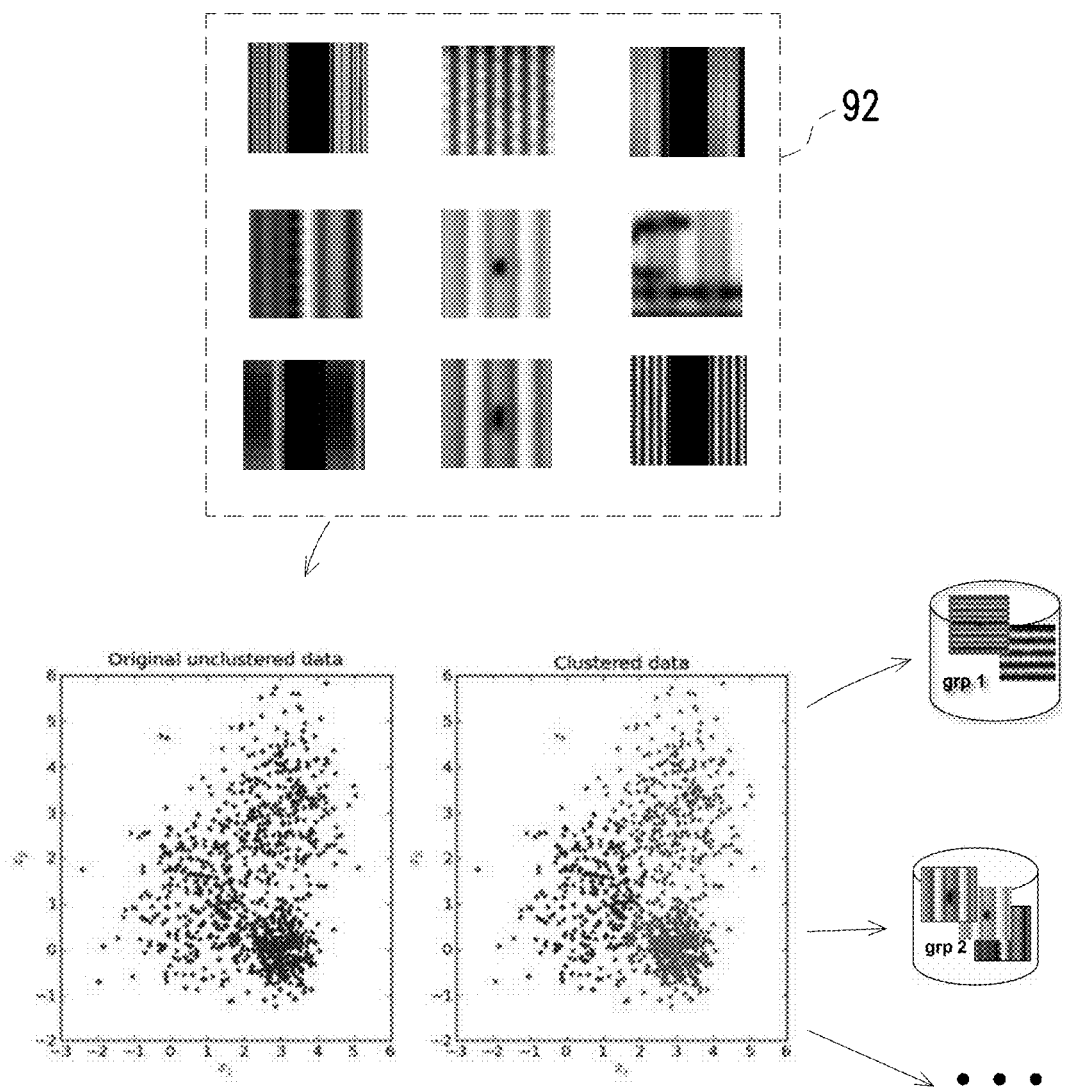
FIG. 9A is a schematic diagram illustrating clustering of the candidate defect images according to an embodiment of the disclosure.
Figure 9B:
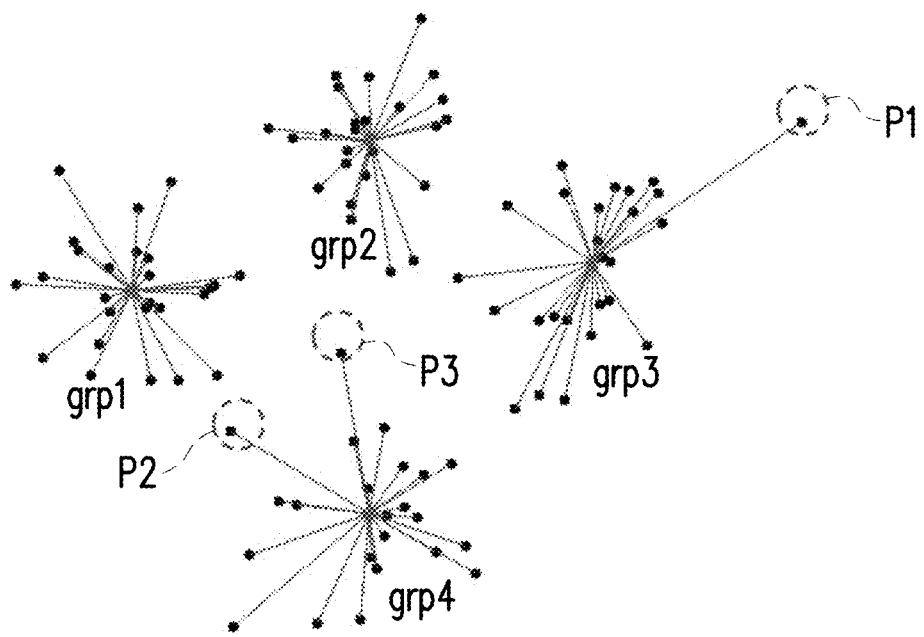
FIG. 9B is a schematic diagram illustrating anomaly detection and diversity sampling according to an embodiment of the disclosure.

For example, FIG. 9A is a schematic diagram illustrating clustering of the candidate defect images according to an embodiment of the disclosure, and FIG. 9B is a schematic diagram illustrating anomaly detection and diversity sampling according to an embodiment of the disclosure.

Referring to FIG. 9A, samples respectively representing the candidate defect images (e.g. images 92) are distributed in a feature space as shown in graph 94 and are clustered into multiple groups (e.g. groups grp 1 and grp 2) as shown in graph 96 by using the clustering algorithm.

Referring to FIG. 9B, in anomaly detection, positions of the group centroids are calculated and distances away from nearby group centroids of the samples are respectively calculated. The samples much farther away from the cluster centroids, the orphan samples and the samples in small clusters are detected as anomaly and the corresponding candidate defect images are determined as real defect images.

On the other hand, in diversity sampling, one or more samples ranked in front of each group by some attributes may represent the group and the corresponding candidate defect images are transmitted to the defect review tool 300 for microscopic review. If the corresponding candidate defect images of the samples are verified as real defect images and then all the candidate defect images of the samples in the same group can be determined as real defect images. Otherwise, the candidate defect images of the samples in the same group are determined as nuisance images.

Back to the flow in FIG. 8, in step S806, the processor 140 of the defect inspection system 100 retrieves a plurality of candidate defect images from a plurality of inspection images obtained by at least one optical inspection tool 200 performing hot scans on at least one wafer and extracts a plurality of attributes from the inspection images. In step S808, the processor 140 creates a random forest classifier including a plurality of decision trees (i.e. the classifiers as shown in FIG. 8) for classifying the candidate defect images, wherein the decision trees are built with different subset of the attributes and the candidate defect images. Aforementioned steps S806 to S808 are similar or identical to steps S302 to S304 in the foregoing embodiment, and thus detailed content regarding the same is not repeated herein.

In the runtime, in step S810, the processor 140 retrieves a plurality of candidate defect images from one of the optical inspection tool 200 and then applies the candidate defect images to the decision trees in the random forest classifier, classifies the candidate defect images into nuisance images and real defect images according to votes of the decision trees, and filters out the nuisance images from the candidate defect images. The defect confidence of each of the real defect images is determined by comparing the votes of the decision trees with a confidence value so as to sample the real defect images (including killer defect images) with the votes over the confidence value.

In step S812, the processor 140 combines the sampled real defect images with the votes over the confidence value with sampling (i.e. the sampled candidate defect images) in the unsupervised learning as a union of real defect images. The union of real defect images is then transmitted to the defect review tool 300 through the second connecting device 130 for microscopic review.

In some embodiments, due to the process change, new defect types that have not been seen in training wafers may occur. Since the classifiers trained by the defect inspection system 100 are based on the training wafers, the new defect types may not be recognized by those classifiers and regarded as lost defect types. Therefore, in the present embodiment, a union with the defect images obtained by unsupervised learning from the optical inspection tool 200 is further performed to secure the defect type coverage and capture new defect types in new wafers. The union may also be used to check the health of the classifiers trained by the defect inspection system 100.

In step S814, the defect review tool 300 performs, for example, a scanning electron microscope (SEM) review on the union of real defect images provided by the defect inspection system 100 so as to verify real defects and nuisances in the union of real defect images.

Accordingly, in step S816, the processor 140 determines whether there are new defect types observed in the microscopic review and proceeds to update the random forest classifier as trained in step S808 by re-training the decision trees in the random forest classifier with the candidate defect images obtained from the unsupervised learning.

In detail, according to the review result output by the defect review tool 300, the processor 140 may obtain the defect types recognized by the defect review tool 300 in the microscopic review on the union of real defect images and compares the defect types with known defect types found in the training of the random forest classifier so as to find new defect types.

Figure 10:
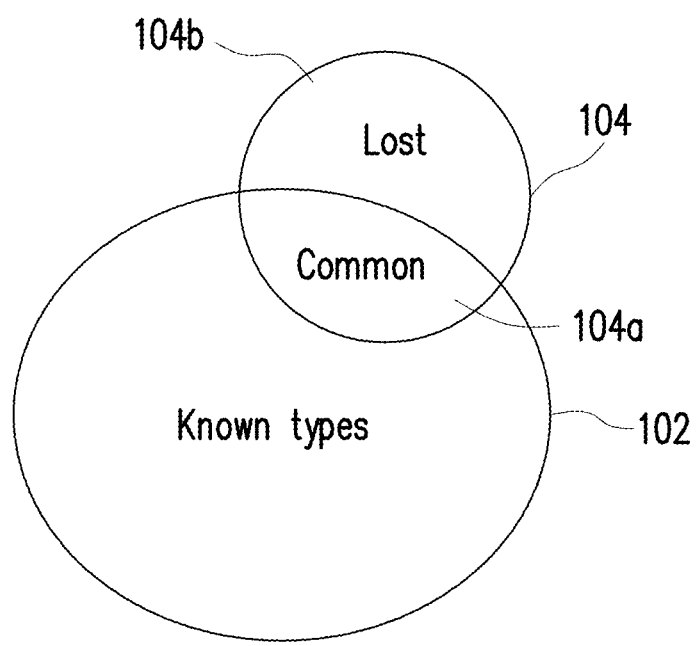
FIG. 10 is a schematic diagram illustrating the population of the defect types found in supervised learning and unsupervised learning according to an embodiment of the disclosure.

For example, FIG. 10 is a schematic diagram illustrating the population of the defect types found in supervised learning and unsupervised learning according to an embodiment of the disclosure. Referring to FIG. 10, the known types 112 indicate the defect types found by the classifier in the supervised learning and the defect types 114 indicate the defect types found in diversity sampling (i.e. unsupervised learning) in which the defect types in area 114a indicate the common types with the known types 112 while the defect types in area 114b indicate the lost types that are first recognized in the learning process.

In some embodiments, the processor 140 may display a graph illustrating the counts of all the recognized defect types on a customized user interface for the operator to review and mark the new defect types to notify the operator to update the classifier and proceeds to update the classifier upon receiving the instruction of the operator. In some embodiments, the processor 140 may calculate a defect loss rate by dividing the counts of the lost types (e.g. the defect types in area 114b) with the total counts of defect types found in diversity sampling (e.g. the defect types 114) and automatically proceed to update the classifier whenever the calculated defect loss rate is over a predetermined threshold. In some embodiments, the processor 140 may trigger a healthy alarm via sound, calls, emails or instant messages to notify the operator to check the recipe of the manufacturing process and correct the manufacturing process that may cause the defects.

According to some embodiments, a defect inspection method adapted to an electronic apparatus is provided. In the method, a plurality of candidate defect images are retrieved from a plurality of inspection images obtained by at least one optical inspection tool performing hot scans on at least one wafer and a plurality of attributes are extracted from the inspection images. A random forest classifier including a plurality of decision trees for classifying the candidate defect images is created, wherein the decision trees are built with different subset of the attributes and the candidate defect images. A plurality of candidate defect images are retrieved from one of the at least one optical inspection tool in runtime and applied to the decision trees in the random forest classifier. The candidate defect images are classified into nuisance images and real defect images according to votes of the decision trees and the nuisance images are filtered out from the candidate defect images. The real defect images with the votes over a confidence value are sampled for microscopic review.

According to some embodiments, a defect inspection system includes a first connecting device configured to connect at least one optical inspection tool, a second connecting device configured to connect a defect review tool, a storage medium configured to store the candidate defect images retrieved by the first connecting device, and a processor coupled to the first connecting device, the second connecting device and the storage medium. The processor is configured to execute instructions to perform steps of retrieving a plurality of candidate defect images from a plurality of inspection images obtained by the at least one optical inspection tool performing hot scans on at least one wafer by using the first connecting device and extracting a plurality of attributes from the inspection images, creating a random forest classifier including a plurality of decision trees for classifying the candidate defect images in which the decision trees are built with different subset of the attributes and the candidate defect images, retrieving a plurality of candidate defect images from one of the at least one optical inspection tool in runtime by using the first connecting device, applying the candidate defect images to the decision trees in the random forest classifier, classifying the candidate defect images into nuisance images and real defect images according to votes of the decision trees, filtering out the nuisance images from the candidate defect images, and sampling the real defect images with the votes over a confidence value and transmitting the sampled real defect images to the defect review tool for microscopic review by using the second connecting device.

According to some embodiments, a defect inspection method adapted to an electronic apparatus is provided. In the method, a plurality of candidate defect images are retrieved from a plurality of inspection images obtained by at least one optical inspection tool performing hot scans on at least one wafer and a plurality of attributes are extracted from the inspection images. A first random forest classifier including a plurality of first decision trees is created for classifying the candidate defect images, wherein the first decision trees are built with different first subset of the attributes and the candidate defect images. A second random forest classifier including a plurality of second decision trees is created for classifying the candidate defect images, wherein the second decision trees are built with different second subset of the attributes and the candidate defect images, and the first subset of the attributes and has a complexity in a decision boundary higher than a complexity in a decision boundary of the second subset of the attributes. A plurality of candidate defect images are retrieved from one of the at least one optical inspection tool in runtime and applied the candidate defect images to the first decision trees in the first random forest classifier. The candidate defect images are classified into nuisance images and real defect images according to votes of the first decision trees, and the nuisance images are filtered out from the candidate defect images. The rest of the candidate defect images after filtering are applied to the second decision trees in the second random forest classifier and the candidate defect images are classified into nuisance images and real defect images according to votes of the first decision trees, and the nuisance images are filtered out from the candidate defect images. The real defect images with the votes over a confidence value are sampled for microscopic review.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A defect inspection method, adapted to an electronic apparatus, the method comprising:
    retrieving a plurality of candidate defect images from a plurality of inspection images obtained by at least one optical inspection tool performing hot scans on at least one wafer and extracting a plurality of attributes from the inspection images, wherein the plurality of attributes comprise a rippleness;
    creating a random forest classifier including a plurality of decision trees for classifying the plurality of candidate defect images, wherein each of the plurality of decision trees is built with a set of the plurality of attributes and the plurality of candidate defect images, and the rippleness between each of the set of the plurality of candidate defect images and a plurality of ripple images is calculated and imported into the respective decision tree as a training factor;

retrieving a plurality of candidate defect images from one of the at least one optical inspection tool in runtime;

applying the plurality of candidate defect images to the plurality of decision trees in the random forest classifier, classifying the plurality of candidate defect images into nuisance images and real defect images according to votes of the plurality of decision trees, and filtering out the nuisance images from the plurality of candidate defect images; and sampling the real defect images with the votes over a confidence value for microscopic review.

2. The defect inspection method according to claim 1, wherein after retrieving a plurality of candidate defect images from one of the optical inspection tool in runtime, the method further comprises:

applying the plurality of candidate defect images to a plurality of first decision trees in a first random forest classifier and filtering out the nuisance images according to votes of the plurality of first decision trees on the plurality of candidate defect images; and applying the rest of the plurality of candidate defect images after filtering to a plurality of second decision trees in a second random forest classifier and filtering out the nuisance images according to votes of the plurality of second decision trees on the rest of the plurality of candidate defect images, wherein each of the plurality of first decision trees is built with a first subset set of the plurality of attributes and each of the plurality of second decision trees is built with a second set of the plurality of attributes having a complexity in a decision boundary higher than a complexity in a decision boundary of the first set of the plurality of attributes.

3. The defect inspection method according to claim 1, wherein classifying the plurality of candidate defect images into the nuisance images and the real defect images according to the votes of the plurality of decision trees comprises:

classifying the candidate defect images with the votes higher than or equal to a first confidence value as images of high confidence defect;

classifying the candidate defect images with the votes lower than the first confidence value and higher than or equal to a second confidence value as images of marginal defect; and classifying the candidate defect ages with the votes lower than the second confidence value as the nuisance images, wherein the first confidence value is higher than the second confidence value.

4. The defect inspection method according to claim 3, further comprising:

applying the images of high confidence defect for the microscopic review to verify the real defect images among the images of high confidence defect;

sampling the images of marginal defect with a sampling rate and applying the sampled images of marginal defect for the microscopic review to verify the real defect images among the images of marginal defect;

estimating a defect count by adding a number of the verified real defect images among the images of high confidence defect to a total of the real defect images among the images of marginal defect, wherein the total of the real defect images among the images of marginal defect is deduced by dividing a number of the verified real defect images among the images of marginal defect by the sampling rate.

5. The defect inspection method according to claim 1, further comprising:

clustering the plurality of candidate defect images into a plurality of groups;

performing an unsupervised learning on the groups to sample the plurality of candidate defect images, wherein the unsupervised learning comprises anomaly detection or diversity sampling;

combining the sampled real defect images with the votes over the confidence value and the sampled candidate defect images in the unsupervised learning for the microscopic review.

6. The defect inspection method according to claim 5, wherein after combining the sampled real defect images with the votes over the confidence value and the sampled candidate defect images in the unsupervised learning for the microscopic review, the method further comprises:

determining whether there are new defect types observed in the microscopic review; and updating the random forest classifier by re-training the plurality of decision trees in the random forest classifier with the plurality of candidate defect images in the unsupervised learning if the new defect types are found.

7. The defect inspection method according to claim 1, wherein after the step of sampling the real defect images with the votes over the confidence value for microscopic review, the method further comprises repeatedly performing the retrieving step, the classifying step and the sampling step so as to perform defect inspection on another wafer.

8. The defect inspection method according to claim 1, wherein the plurality of attributes further comprise a tool ID of the optical inspection tool, and a region ID of a region in the wafer.

9. A defect inspection system, comprising:

a first connecting device, configured to connect at least one optical inspection tool;

a second connecting device, configured to connect a defect review tool;

a storage medium, configured to store images retrieved by the first connecting device;

a processor, coupled to the first connecting device, the second connecting device and the storage medium, and configured to execute instructions to perform steps of:

retrieving a plurality of candidate defect images from a plurality of inspection images obtained by the at least one optical inspection tool performing hot scans on at least one wafer by using the first connecting device and extracting a plurality of attributes from the inspection images, wherein the plurality of attributes comprise a rippleness;

creating a random forest classifier including a plurality of decision trees for classifying the plurality of candidate defect images, wherein each of the plurality of decision trees is built with a set of the plurality of attributes and the plurality of candidate defect images, and the rippleness between each of the set of the plurality of candidate defect images and a plurality of ripple images is calculated and imported into the respective decision tree as a training factor;

retrieving a plurality of candidate defect images from one of the at least one optical inspection tool in runtime by using the first connecting device;

applying the plurality of candidate defect images to the plurality of decision trees in the random forest classifier, classifying the plurality of candidate defect images into nuisance images and real defect images according to votes of the plurality of decision trees, and filtering out the nuisance images from the plurality of candidate defect images; and sampling the real defect images with the votes over a confidence value and transmitting the sampled real defect images to the defect review tool for microscopic review by using the second connecting device.

10. The defect inspection system according to claim 9, wherein the processor comprise applying the plurality of candidate defect images to a plurality of first decision trees in a first random forest classifier and filtering out the nuisance images according to votes of the plurality of first decision trees on the plurality of candidate defect images, and applying the rest of the plurality of candidate defect images after filtering to a plurality of second decision trees in a second random forest classifier and filtering out the nuisance images according to votes of the plurality of second decision trees on the rest of the plurality of candidate defect images, wherein each of the plurality of first decision trees is built with a first set of the plurality of attributes and each of the plurality of second decision trees is built with a second set of the plurality of attributes having a complexity in a decision boundary higher than a complexity in a decision boundary of the first set of the plurality of attributes.

11. The defect inspection system according to claim 9, wherein the processor comprises classifying the plurality of candidate defect images with the votes higher than or equal to a first confidence value as images of high confidence defect, classifying the candidate defect images with the votes lower than the first confidence value and higher than or equal to a second confidence value as images of marginal defect, and classifying the candidate defect images with the votes lower than the second confidence value as the nuisance images, wherein the first confidence value is higher than the second confidence value.

12. The defect inspection system according to claim 11, wherein the processor further comprises applying the images of high confidence defect for the microscopic review to verify the real defect images among the images of high confidence defect, sampling the images of marginal defect with a sampling rate and applying the sampled images of marginal defect for the microscopic review to verify the real defect images among the images of marginal defect, estimating a defect count by adding a number of the verified real defect images among the images of high confidence defect to a total of the real defect images among the images of marginal defect, wherein the total of the real defect images among the images of marginal defect is deduced by dividing a number of the verified real defect images among the images of marginal defect by the sampling rate.

13. The defect inspection system according to claim 9, wherein the processor further comprises clustering the plurality of candidate defect images into a plurality of groups, performing an unsupervised learning on the groups to sample the plurality of candidate defect images, and combining the sampled real defect images with the votes over the confidence value and the sampled candidate defect images in the unsupervised learning for the microscopic review, wherein the unsupervised learning comprises anomaly detection or diversity sampling.

14. The defect inspection system according to claim 13, wherein the processor further comprises determining whether there are new defect types observed in the microscopic review, and updating the random forest classifier by re-training the plurality of decision trees in the random forest classifier with the plurality of candidate defect images in the unsupervised learning if the new defect types are found.

15. The defect inspection system according to claim 9, wherein each of the plurality of decision trees is trained with a portion of the plurality of candidate defect images and a performance of the decision tree is checked whether stable with the other portion of the plurality of candidate defect images.

16. The defect inspection system according to claim 9, wherein the plurality of attributes further comprise a tool ID of the optical inspection tool, and a region ID of a region in the wafer.

17. A defect inspection method, adapted to an electronic apparatus, the method comprising:

retrieving a plurality of candidate defect images from a plurality of inspection images obtained by at least one optical inspection tool performing hot scans on at least one wafer and extracting a plurality of attributes from the inspection images wherein the plurality of attributes comprise a rippleness;

creating a first random forest classifier including a plurality of first decision trees for classifying the plurality of candidate defect images, wherein each of the plurality of first decision trees is built with a first set of the plurality of attributes and the plurality of candidate defect images, and the rippleness between each of the first set of the plurality of candidate defect images and a plurality of ripple images is calculated and imported into the respective first decision tree as a training factor;

creating a second random forest classifier including a plurality of second decision trees for classifying the plurality of candidate defect images, wherein each of the plurality of second decision trees is built with a second set of the plurality of attributes and the plurality of candidate defect images, and the first set of the plurality of attributes and has a complexity in a decision boundary higher than a complexity in a decision boundary of the second set of the plurality of attributes, and the rippleness between each of the second set of the plurality of candidate defect images and the plurality of ripple images is calculated and imported into the respective second decision tree as a training factor;

retrieving a plurality of candidate defect images from one of the at least one optical inspection tool in runtime;

applying the plurality of candidate defect images to the plurality of first decision trees in the first random forest classifier, classifying the plurality of candidate defect images into nuisance images and real defect images according to votes of the plurality of first decision trees, and filtering out the nuisance images from the plurality of candidate defect images;

applying the rest of the plurality of candidate defect images after filtering to the plurality of second decision trees in the second random forest classifier and classifying the plurality of candidate defect images into nuisance images and real defect images according to votes of the plurality of first decision trees, and filtering out the nuisance images from the plurality of candidate defect images; and sampling the real defect images with the votes over a confidence value for microscopic review.

18. The defect inspection method according to claim 17, further comprising:

clustering the plurality of candidate defect images into a plurality of groups;

performing an unsupervised learning on the groups to sample the plurality of candidate defect images;

combining the sampled real defect images with the votes over the confidence value and the sampled candidate defect images in the unsupervised learning for microscopic review.

19. The defect inspection method according to claim 18, wherein after combining the sampled real defect images with the votes over the confidence value and the sampled candidate defect images in the unsupervised learning for the microscopic review, the method further comprises:

determining whether there are new defect types observed in the microscopic review; and updating the first random forest classifier and the second random forest classifier by re-training the plurality of decision trees in the first random forest classifier and the second random forest classifier with the plurality of candidate defect images in the unsupervised learning if the new defect types are found.

20. The defect inspection method according to claim 17, wherein the plurality of attributes further comprise a tool ID of the optical inspection tool, and a region ID of a region in the wafer.

\* \* \* \* \*